(12) United States Patent
Bergstedt et al.

(10) Patent No.: US 8,681,427 B2
(45) Date of Patent: Mar. 25, 2014

(54) SYSTEM AND METHOD FOR SEPARATING A MAIN PULSE AND A PRE-PULSE BEAM FROM A LASER SOURCE

(75) Inventors: Robert A. Bergstedt, Carlsbad, CA (US); Christopher Paul Pate, San Diego, CA (US); Jason Michael Arcand, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 115 days.

(21) Appl. No.: 13/535,148

(22) Filed: Jun. 27, 2012

(65) Prior Publication Data
US 2013/0321926 A1 Dec. 5, 2013

Related U.S. Application Data

(60) Provisional application No. 61/654,003, filed on May 31, 2012.

(51) Int. Cl.
*G02B 27/14* (2006.01)
(52) U.S. Cl.
CPC ................................... *G02B 27/145* (2013.01)
USPC ........................................... 359/634; 359/629
(58) Field of Classification Search
USPC ................ 359/33, 34, 618, 629, 634
See application file for complete search history.

(56) References Cited

U.S. PATENT DOCUMENTS

| | | | |
|---|---|---|---|
| 7,212,275 B2 | 5/2007 | Ohtsuki | |
| 8,073,017 B1 | 12/2011 | Hooper et al. | |
| 2005/0117189 A1 | 6/2005 | Murakawa et al. | |
| 2006/0216927 A1 | 9/2006 | Cordingly et al. | |
| 2008/0087847 A1 | 4/2008 | Bykanov et al. | |
| 2008/0266470 A1 | 10/2008 | Muramoto | |
| 2010/0078577 A1 | 4/2010 | Moriya et al. | |
| 2012/0082088 A1 | 4/2012 | Dalsgaard et al. | |
| 2012/0083771 A1 | 4/2012 | Warm et al. | |
| 2012/0087386 A1 | 4/2012 | Brown et al. | |
| 2012/0092746 A1 | 4/2012 | Hou et al. | |
| 2013/0286360 A1* | 10/2013 | Kawamura et al. | 353/33 |

* cited by examiner

*Primary Examiner* — William Choi
(74) *Attorney, Agent, or Firm* — Gard & Kaslow LLP

(57) ABSTRACT

A dichroic beam splitter module is disclosed for separating a main pulse laser beam from a pre-pulse laser beam each traversing a common beam path. In one embodiment, two dichroic elements are physically aligned along the beam path and are configured to pass the pre-pulse, a laser light having a first wavelength, to target material located near an irradiation site yet reflect the main pulse, a laser light having a second wavelength. The reflected main pulse is then further reflected by two reflective elements or mirrors from the first dichroic element to the second dichroic element and then on to the irradiation site. In alternative embodiments, the first mirror is deformable to alter beam characteristics of the reflected main pulse beam and the second mirror is adjustable to align the main pulse beam to the irradiation site.

24 Claims, 5 Drawing Sheets

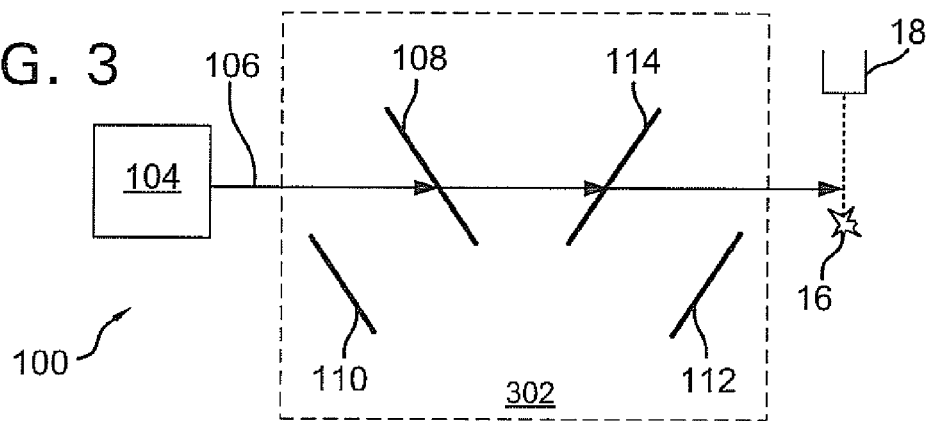
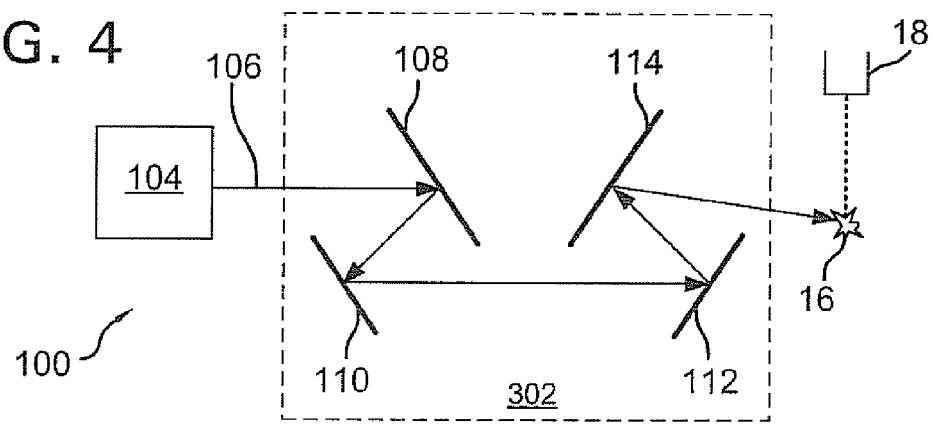
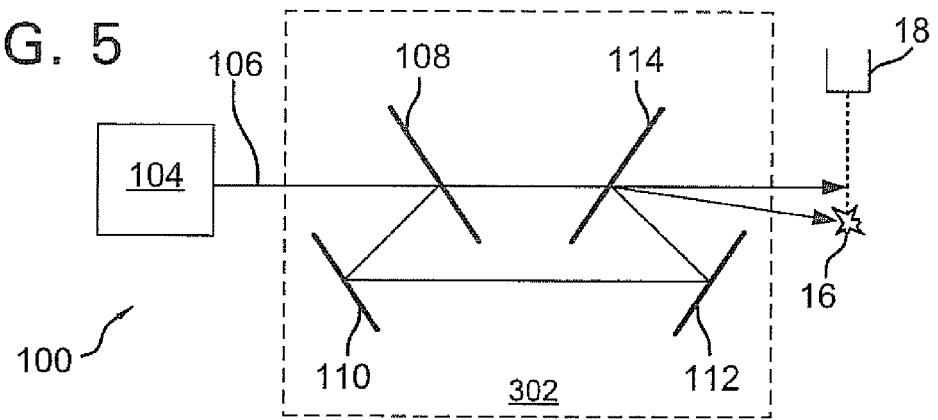

SYSTEM AND METHOD FOR SEPARATING A MAIN PULSE AND A PRE-PULSE BEAM FROM A LASER SOURCE

This application claims priority to U.S. Provisional Patent Application No. 61/654,003 filed on May 31, 2012 and entitled "System and Method for Separating a Main Pulse and a Pre-Pulse Beam from a Laser Source" which is incorporated herein by reference in its entirety.

FIELD OF THE INVENTION

The present invention relates generally to laser produced plasma extreme ultraviolet light sources. More specifically, the invention relates to a method and apparatus for the use of seed lasers as such light sources.

BACKGROUND OF THE INVENTION

The semiconductor industry continues to develop lithographic technologies which are able to print ever-smaller integrated circuit dimensions. Extreme ultraviolet ("EUV") light (also sometimes referred to as soft x-rays) is generally defined to be electromagnetic radiation having wavelengths of between 10 and 120 nanometers (nm). EUV lithography is currently generally considered to include EUV light at wavelengths in the range of 10-14 nm, and is used to produce extremely small features, for example, sub-32 nm features, in substrates such as silicon wafers. To be commercially useful, it is desirable that these systems be highly reliable and provide cost effective throughput and reasonable process latitude.

Methods to produce EUV light include, but are not necessarily limited to, converting a material into a plasma state that has one or more elements, e.g., xenon, lithium, tin, indium, antimony, tellurium, aluminum, etc., with one or more emission line(s) in the EUV range. In one such method, often termed laser produced plasma ("LPP"), the required plasma can be produced by irradiating a target material, such as a droplet, stream or cluster of material having the desired line-emitting element, with a laser beam at an irradiation site. The line-emitting element may be in pure form or alloy form, for example, an alloy that is a liquid at desired temperatures, or may be mixed or dispersed with another material such as a liquid.

In some prior art LPP systems, droplets in a droplet stream are irradiated by a separate laser pulse to form a plasma from each droplet. Alternatively, some prior art systems have been disclosed in which each droplet is sequentially illuminated by more than one light pulse. In some cases, each droplet may be exposed to a so-called "pre-pulse" to heat, expand, gasify, vaporize, and/or ionize the target material and/or generate a weak plasma, followed by a so-called "main pulse" to generate a strong plasma and convert most or all of the pre-puke affected material into plasma and thereby produce an EUV light emission. It will be appreciated that more than one pre-pulse may be used and more than one main puke may be used, and that the functions of the pre-pulse and main pulse may overlap to some extent.

Since EUV output power in an LPP system generally scales with the drive laser power that irradiates the target material, in some cases it may also be considered desirable to employ an arrangement including a relatively low-power oscillator, or "seed laser," and one or more amplifiers to amplify the pulses from the seed laser. The use of a large amplifier allows for the use of the seed laser while still providing the relatively high power pulses used in the LPP process.

However, in such seed lasers a main pulse and a pre-pulse may follow a common beam path through some portions for various reasons including reducing component count in such seed laser modules.

Accordingly, it is desirable to have an improved system and method for separating the main pulse from the pre-pulse beam at the seed laser exit in such an EUV light source.

SUMMARY OF THE INVENTION

Disclosed herein are a method and apparatus for separating the main pulse beam from the pre-pulse beam in a laser produced plasma (up) extreme ultraviolet (EUV) light system using a dichroic beam splitter module.

In one embodiment is a system comprising a laser source configured to produce a first laser light having a first wavelength along a beam path and configured to produce a second laser light having a second wavelength along the beam path and a beam splitter module comprising: (i) a first dichroic element configured to receive the first laser light along the beam path and pass the first laser light having the first wavelength, the first dichroic element further configured to receive the second laser light along the beam path and reflect the second laser light having the second wavelength; (ii) a first mirror configured to receive the second laser light reflected from the first dichroic element and reflect the received second laser light; (iii) a second mirror configured to receive the second laser light reflected from the first mirror and reflect the received second laser light; and (iv) a second dichroic element configured to receive from the first dichroic element the first laser light and pass the first laser light having the first wavelength and configured to receive the second laser light reflected from the second mirror and reflect the second laser light having the second wavelength.

In a further embodiment of the system, wherein the second dichroic element configured to pass the first laser light having the first wavelength is configured to pass the first laser light to target material near an irradiation site.

In a still further embodiment of the system, wherein the second dichroic element configured to reflect the second laser light having the second wavelength is configured to reflect the second laser light to the irradiation site.

In a yet further embodiment of the system, the first mirror is a deformable mirror.

In a yet still further embodiment of the system, the second mirror is an adjustable mirror.

In another embodiment is a method comprising generating a laser pre-pulse having a first wavelength along a beam path, passing the laser pre-pulse through a first dichroic element and a second dichroic element to target material near an irradiation site, generating a laser main pulse having a second wavelength along the beam path, reflecting the laser main pulse by the first dichroic element to a first mirror, reflecting the laser main pulse from the first mirror to a second mirror, reflecting the laser main pulse from the second mirror to the second dichroic element, and reflecting the laser main pulse from the second dichroic element to the irradiation site.

In yet another embodiment is a non-transitory computer-readable medium having embodied thereon a program, the program being executable by a processor to perform a method of protecting a laser pulse source from pulse reflections, the method comprising the steps of generating a laser pre-pulse having a first wavelength along a beam path, passing the laser pre-pulse through a through a first dichroic element and a second dichroic element to target material ear an irradiation site, generating a laser main pulse having a second wavelength along the beam path, reflecting the laser main pulse by the first dichroic element to a first mirror, reflecting the laser main pulse from the first mirror to a second mirror, reflecting the laser main pulse from the second mirror to the second dichroic element, and reflecting the laser main pulse from the second dichroic element to the irradiation site.

BRIEF DESCRIPTION OF THE DRAWINGS

FIG. 3 is an illustration of some of the components of an embodiment of a dichroic beam splitter module.

FIG. 4 is another illustration of some of the components of an embodiment of a dichroic beam splitter module.

FIG. 5 is yet another illustration of some of the components of an embodiment of a dichroic beam splitter module.

DETAILED DESCRIPTION OF THE INVENTION

Various methods and apparatus are described herein for separating the main pulse from the pre-pulse beam in a laser produced plasma (LPP) extreme ultraviolet (EUV) light system using a dichroic beam splitter module.

Figure 1:
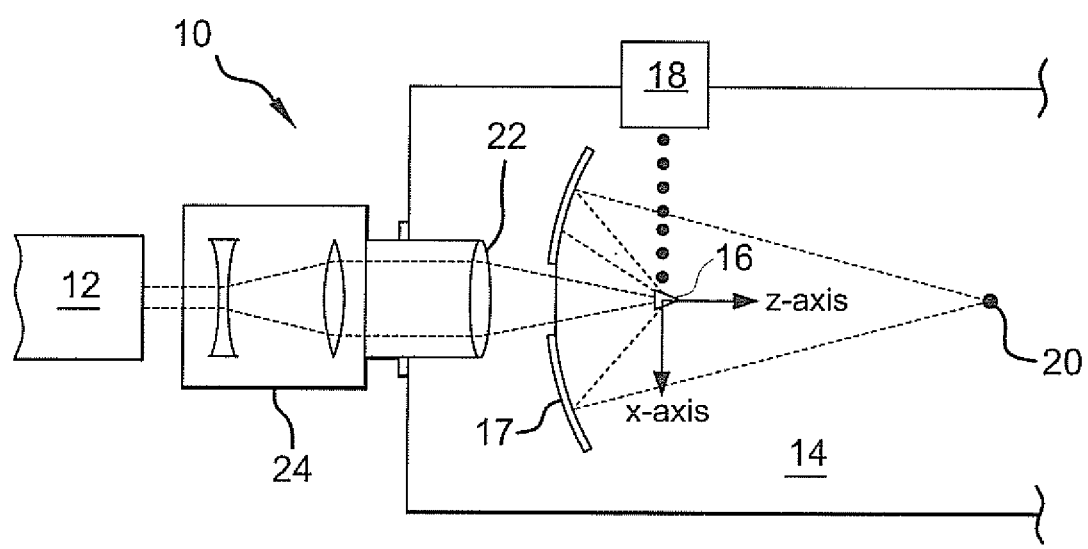
FIG. 1 is an illustration of some of the components of an embodiment of an LPP EUV system.

FIG. 1 is a simplified schematic view of some of the components of one embodiment of an LPP EUV light source 10. As shown in FIG. 1, the EUV light source 10 includes a laser source 12 for generating a beam of laser pulses and delivering the beam along one or more beam paths from the laser source 12 and into a chamber 14 to illuminate a respective target, such as a droplet, at an irradiation region or site 16. Examples of laser arrangements that may be suitable for use in the system 12 shown in FIG. 1 are described in more detail below.

As also shown in FIG. 1, the EUV light source 10 may also include a target material delivery system 18 that, for example, delivers droplets of a target material into the interior of chamber 14 to the irradiation region 16, where the droplets will interact with one or more laser pulses to ultimately produce plasma and generate an EUV emission. Various target material delivery systems have been presented in the prior art, and their relative advantages will be apparent to those of skill in the art.

As described above, the target material is an EUV emitting element that may include, but is not necessarily limited to, a material that includes tin, lithium, xenon or combinations thereof. The target material may be in the form of liquid droplets, or alternatively may be solid particles contained within liquid droplets. For example, the element tin may be presented as a target material as pure tin, as a tin compound, such as $SnBr_4$, $SnBr_2$, $SnH_4$, as a tin alloy, e.g., tin-gallium alloys, tin-indium alloys, or tin-indium-gallium alloys, or a combination thereof. Depending on the material used, the target material may be presented to the irradiation region 16 at various temperatures including room temperature or near room temperature (e.g., tin alloys or $SnBr_4$), at a temperature above room temperature (e.g., pure tin), or at temperatures below room temperature (e.g., $SnH_4$). In some cases, these compounds may be relatively volatile, such as $SnBr_4$. Similar alloys and compounds of EUV emitting elements other than tin, and the relative advantages of such materials and those described above will be apparent to those of skill in the art.

Returning to FIG. 1, the EUV light source 10 may also include an optical element 17 such as a near-normal incidence collector mirror having a reflective surface in the form of a prolate spheroid (i.e., an ellipse rotated about its major axis), such that the optical element 17 has a first focus within or near the irradiation region 16 and a second focus at a so-called intermediate region 20 where the EUV light may be output from the EUV light source 10 and input to a device utilizing EUV light such as an integrated circuit lithography tool (not shown). As shown in FIG. 1, the optical element 17 is formed with an aperture to allow the laser light pulses generated by the laser source 12 to pass through and reach the irradiation region 16.

The optical element 17 should have an appropriate surface for collecting the RN light and directing it to the intermediate region 20 for subsequent delivery to the device utilizing the EUV light. For example, optical element 17 might have a graded multi-layer coating with alternating layers of molybdenum and silicon, and in some cases, one or more high temperature diffusion barrier layers, smoothing layers, capping layers and/or etch stop layers.

It will be appreciated by those of skill in the art that optical elements other than a prolate spheroid mirror may be used as optical element 17. For example, optical element 17 may alternatively be a parabola rotated about its major axis or may be configured to deliver a beam having a ring-shaped cross section to an intermediate location. In other embodiments, optical element 17 may utilize coatings and layers other than or in addition to those described herein. Those of skill in the art will be able to select an appropriate shape and composition for optical element 17 in a particular situation.

As shown in FIG. 1, the EUV light source 10 may include a focusing unit 22 which includes one or more optical elements for focusing the laser beam to a focal spot at the irradiation site. EUV light source 10 may also include a beam conditioning unit 24, having one or more optical elements, between the laser source 12 and the focusing unit 22, for expanding, steering and/or shaping the laser beam, and/or shaping the laser pulses. Various focusing units and beam conditioning units are known in the art, and may be appropriately selected by those of skill in the art.

Figure 2:
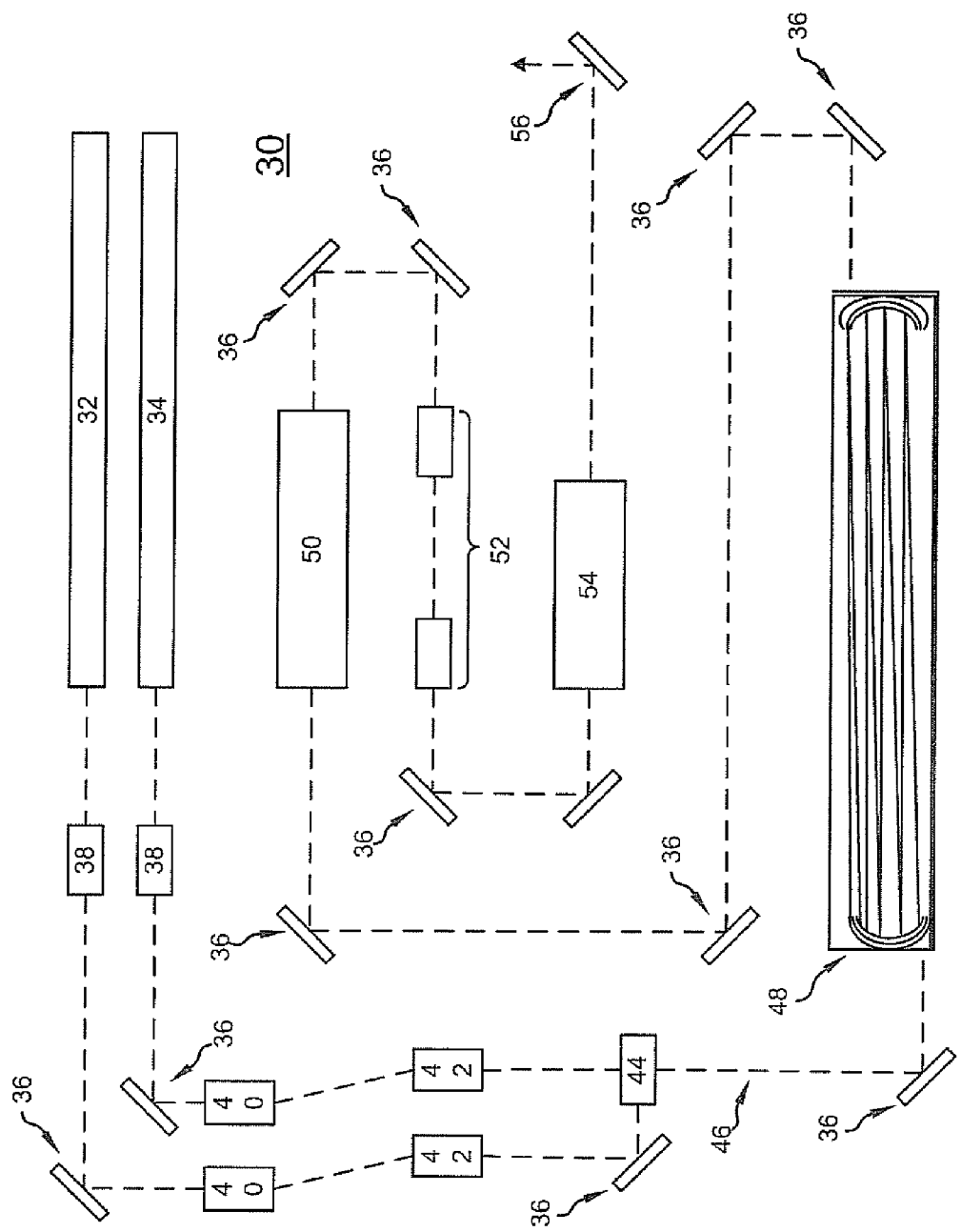
FIG. 2 is an illustration of some of the components of a seed laser module that may be used in an LPP EUV system.

As noted above, in some cases an LPP EUV system uses one or more seed lasers to generate laser pulses, which may then be amplified to become the laser beam that irradiates the target material at irradiation site 16 to form a plasma that produces the EUV emission. FIG. 2 is a simplified schematic view of one embodiment of a seed laser module 30 that may be used as part of the laser light source in an LPP EUV system.

As illustrated in FIG. 2, seed laser module 30 includes two seed lasers, a pre-pulse seed laser 32 and a main pulse seed laser 34. One of skill in the art will appreciate that where such an embodiment containing two seed lasers is used, the target material may be irradiated first by one or more pulses from the pre-pulse seed laser 32 and then by one or more pulses from the main pulse seed laser 34.

Seed laser module 30 is shown as having a "folded" arrangement rather than arranging the components in a straight line. In practice, such an arrangement is typical in order to limit the size of the module. To achieve this, the beams produced by the laser pulses of pre-pulse seed laser 32 and main pulse seed laser 34 are directed onto desired beam paths by a plurality of optical components 36. Depending upon the particular configuration desired, optical components 36 may be such elements as lenses, filters, prisms, mirrors or any other element which may be used to direct the beam in a desired direction. In some cases, optical components 36 may perform other functions as well, such as altering the polarization of the passing beam.

In the embodiment of FIG. 2, the beams from each seed laser are first passed through an electro-optic modulator 38 (EOM). The EOMs 38 are used with the seed lasers as pulse shaping units to trim the pulses generated by the seed lasers to pulses having shorter duration and faster fall-time. A shorter pulse duration and relatively fast fall-time may increase EUV output and light source efficiency because of a short interaction time between the pulse and a target, and because unneeded portions of the pulse do not deplete amplifier gain. While two separate pulse shaping units (EOMs 38) are shown, alternatively a common pulse shaping unit may be used to trim both pre-pulse and main pulse seeds.

The beams from the seed lasers are then passed through acousto-optic modulators (AOMs) 40 and 42. The AOMs 40 and 42 act as "switches" or "shutters," which operate to divert any reflections of the laser pulses from the target material from reaching the seed lasers; as above, seed lasers typically contain sensitive optics, and the AOMs 40 and 42 thus prevent any reflections from causing damage to the seed laser elements. In the embodiment shown here, the beams from each seed laser pass through two AOMs; ver, in some embodiments, the beams from each seed laser may be passed through only a single AOM on each path.

After passing through the AOMs 40 and 42, the two beams are "combined" by beam combiner 44. Since the pulses from each seed laser are generated at different times, this really means that the two temporally separated beams are placed on a common beam path 46 for further processing and use.

After being placed on the common beam path 46, the beam from one of the seed lasers (again, there will only be one at a time) passes through a beam delay unit 48 such as is known in the art and as will be explained further below. Next, the beam is directed through a pre-amplifier 50 and then through a beam expander 52. Following this, the beam passes through a thin film polarizer 54, and is then directed onward by optical component 56, which again is an element which directs the beam to the next stage in the LPP EUV system and may perform other functions as well. From optical component 56, the beam typically passes to one or more optical amplifiers and other components.

Various wavelength tunable seed lasers that are suitable for use as both pre-pulse and main pulse seed lasers are known in the art. For example, in one embodiment a seed laser may be a $CO_2$ laser having a sealed filling gas including $CO_2$ at sub-atmospheric pressure, for example, 0.05 to 0.2 atmospheres, and pumped by a radio-frequency discharge. In some embodiments, a grating may be used to help define the optical cavity of the seed laser, and the grating may be rotated to tune the seed laser to a selected rotational line.

FIGS. 3 through 7 are simplified schematics of various embodiments of a portion of a laser source 100 for use in the light source 12 and/or associated components shown in FIG. 1. Some of the elements shown in these figures correspond to elements that appear in FIGS. 1 and 2 above. In each of these figures, a laser source 100 includes a dichroic beam splitter module for separating the main pulse from the pre-pulse beam traversing a common beam path. More particularly, the dichroic beam splitter module 302 (602 in FIG. 6; 702 in FIG. 7) comprises a first dichroic element 108, a first reflective element or mirror 110 (610 in FIG. 6), a second reflective element or mirror 112 (712 in FIG. 7) and a second dichroic element 114. As will now be explained, first dichroic element 108 and second dichroic element 114 are physically aligned along the beam path and are configured to allow a first beam at one wavelength, such as the pre-pulse beam, to pass through them yet reflect a second beam at another wavelength, such as the main pulse beam.

Referring now to FIG. 3, a first example of laser source 100 with dichroic beam splitter module 302 for separating the main pulse from the pre-pulse beam can be seen. As shown in this example, the device 100 includes a seed laser 104 which produces a pre-pulse beam output on beam path 106 which passes through a dichroic beam splitter module 302 and subsequently interacts with a target material before the target material coming from target material delivery system 18 teaches irradiation site 16.

More particularly, as shown in the figure, the pre-pulse beam from seed laser 104 travels along beam path 106 and enters dichroic beam splitter module 302 where it encounters first dichroic element 108. Because first dichroic element 108 allows passage of laser light having the wavelength of the pre-pulse beam, the pre-pulse beam travels through the first dichroic element 108 until it encounters the second dichroic element 114. Because the second dichroic element 114 also allows passage of laser light having the wavelength of the pre-pulse beam, the pre-pulse beam travels through the second dichroic element 114. After exiting the dichroic beam splitter module 302 the pre-pulse beam then encounters and interacts with the target material to perform its pre-pulse function as described elsewhere herein.

Referring now to FIG. 4, the main pulse beam from seed laser module 104 also travels along beam path 106 and enters dichroic beam splitter module 108 where it encounters first dichroic element 108. Because first dichroic element 108 reflects laser light having the wavelength of the main pulse beam, the main pulse beam is reflected from first dichroic element 108 along a new beam path to first mirror 110 which reflects the main pulse beam to second mirror 112 which, in turn, reflects the main pulse beam to second dichroic element 114. Because second dichroic element 114 also reflects laser light having the wavelength of the main pulse beam, the main pulse beam is reflected from second dichroic element 114 to then interact with the target material at the irradiation site 16 as shown.

Referring now to FIG. 5, which depicts the apparatus and operations of FIG. 3 overlaid onto FIG. 4, it can easily be seen how the pre-pulse and the main pulse, each coming from the seed laser module 104 along the same beam path 106, are separated by the beam splitter module 302 to thereby facilitate the pre-pulse beam encountering the target material before, and in preparation for, the main pulse beam interacting with the target material at the irradiation site 16. In one embodiment, this angular beam separation results in the pre-pulse beam encountering the target material approximately 200 um distant (along the x-axis) from where the main pulse beam encounters the irradiation site 116. Further, it is to be understood that although FIG. 5 depicts both the pre-pulse beam and the main pulse beam traveling through the beam splitter module 302 these beams may be operating at different points in time as explained elsewhere herein.

As has been explained, the first dichroic element 108 and the second dichroic element 114 allow passage of light having one wavelength yet reflect light having another wavelength utilizing dichroic filter characteristics known in the art. More particularly, in one embodiment, these dichroic elements comprise a diamond window in a water-cooled housing (for its thermal characteristics) coated to reflect light at one wavelength (e.g., the main beam at 10.59 microns) yet transmit light at a different wavelength (e.g., the pre-pulse beam at 10.26 microns). Coatings and materials to provide such dichroic filter characteristics are commercially available and known in the art.

It is to be understood that the reflective surface of either first mirror 110 or second mirror 112, or both first mirror 110 and second mirror 112, can be of a fixed, generally flat shape or can have a fixed curved or curvilinear shape.

Figure 6:
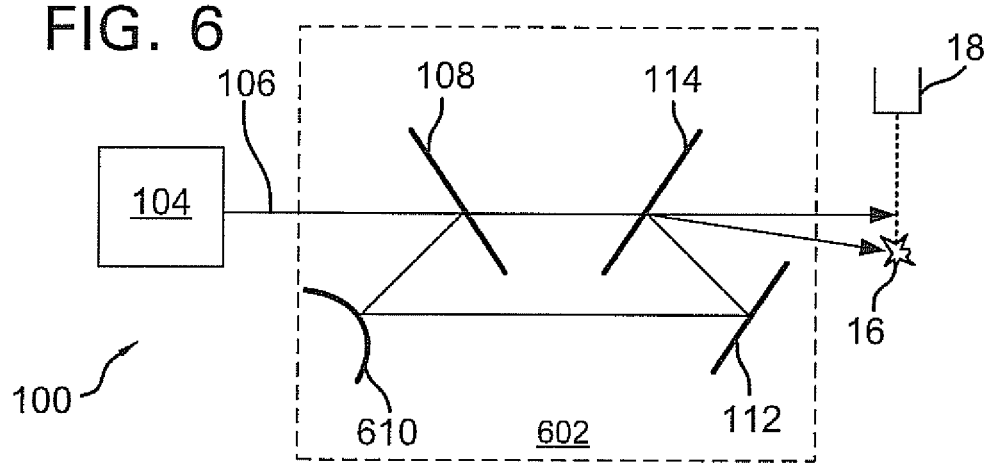
FIG. 6 is an illustration of some of the components of a further embodiment of a dichroic beam splitter module.

An alternative embodiment of a beam splitter module 602 can be seen in FIG. 6 where first mirror 110 of FIGS. 3-5 has been replaced by a deformable mirror 610. Deformable mirror 610 of FIG. 6 performs the reflective function of first mirror 110 of FIGS. 3-5 and also provides the additional capability of compensating or correcting for defocus, astigmatism, coma, spherical and/or higher order aberrations of the main pulse beam which may be caused by thermal effects, fabrication errors, mounting stresses, misalignment, etc., of the dichroic elements and/or any other optical element along the beam path of main pulse beam.

Deformable mirror 610, rather than being a flat reflective element or mirror, is a mirror having a dynamically changeable shape, such as a variable radius mirror (VRM) (examples of which include those sold commercially by II-VI Infrared of Saxonburg, Pa.), a piezo stack array mirror or a piezo monomorph mirror (examples of which include those sold commercially by CILAS of France), a piezo multimorph mirror (examples of which include those sold commercially by Night-N of Russia) or any other mechanically deformable mirror such as a piezoelectric deformable mirror or micromachined membrane deformable mirror (examples of which include those sold commercially by Flexible Optical B.V., also known as OKO Tech, of The Netherlands). In this way, as is known in the art, characteristics of the reflected beam can be altered dynamically by changing the shape of the mirror. Such alterable reflected beam characteristics include focus depth adjustment, compensation for focal length variations, beam diameter, divergence and focus spot size among others as listed above.

Figure 7:
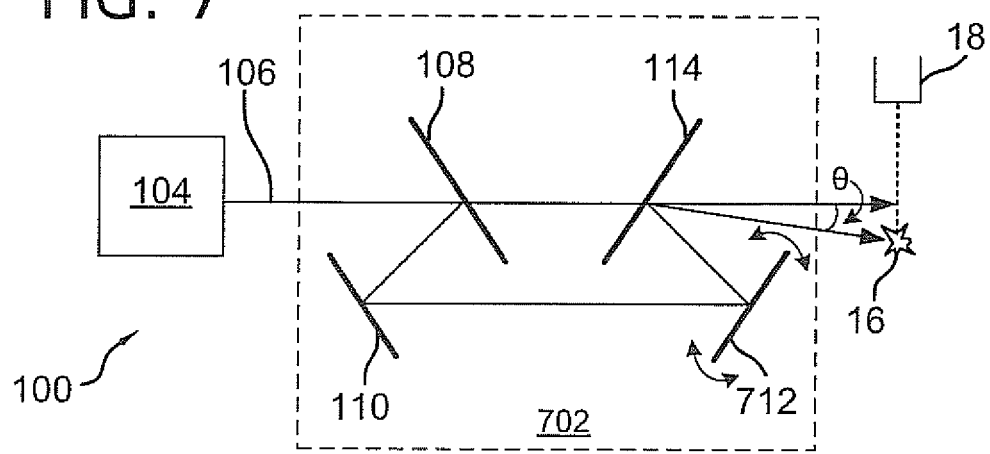
FIG. 7 is an illustration of some of the components of a still further embodiment of a dichroic beam splitter module.

Another alternative embodiment of a beam splitter module 702 can be seen in FIG. 7 where the second mirror 110 of FIGS. 3-5 has been replaced by an adjustable mirror 712 for aligning the main pulse to encounter the radiation site 16. Adjustable mirror 712 can be pivoted or adjusted about an axis to thereby alter the angle of the reflected main pulse beam from the first mirror 110 to the adjustable mirror 712 and then towards the second dichroic element 114. This adjusted reflection angle thereby alters the diverging angle θ between the separated pre-pulse beam passing through the second dichroic element 114 and the main pulse beam reflected by the second dichroic element thereby changing the location at which the main pulse encounters the radiation site 16. This adjustment can also be used to alter the main pulse focal point to address any rearward displacement (along the z-axis) of the target material caused by interaction with the pre-pulse beam.

In a further embodiment, second dichroic element 114 is also adjustable (not shown) to thereby maintain and/or control the pupil location (where the separated pre-pulse beam exits the second dichroic element 114 and intersects the main pulse beam reflecting off the second dichroic element 114) and the diverging angle θ (also referred to herein as the separation angle or output angle).

In a still further embodiment, the adjustable mirror 712 of FIG. 7 can replace the first mirror 110 rather than replace the second mirror 112 as has been shown and described. In such further embodiment, as a yet further variation, the deformable mirror 610 of FIG. 6 can replace the second mirror 112.

In a still further alternative embodiment, a beam splitter module according to the present approach may include both the deformable mirror 610 of FIG. 6 and the adjustable mirror 712 of FIG. 7.

In a yet further alternative embodiment, the deformable mirror 610 of FIG. 6 and the adjustable mirror 712 of FIG. 7 can be combined into a single element taking the place of either or both of first mirror 110 and second mirror 112 to thereby accomplish the same functions as has been described herein.

Figure 8:
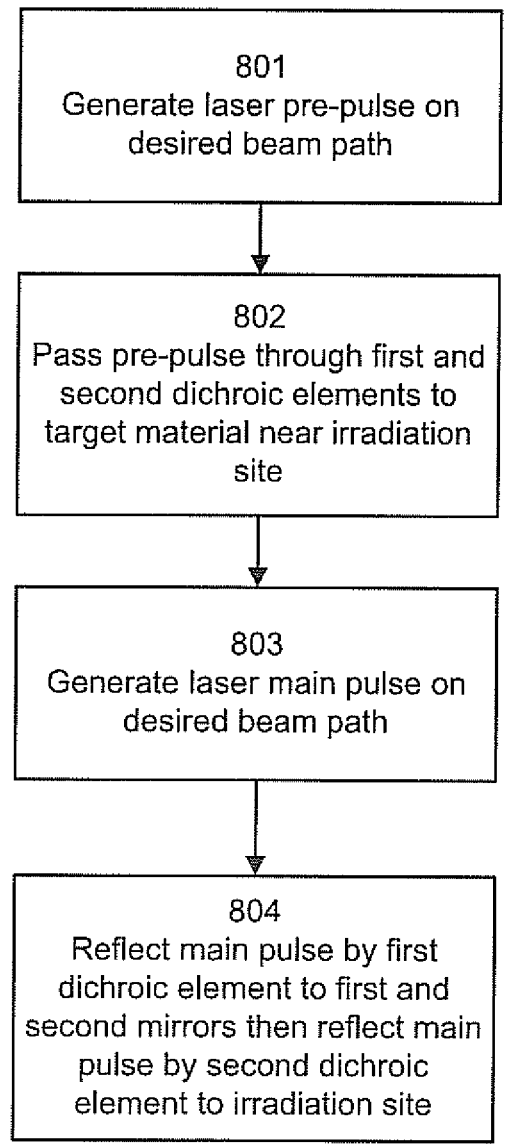
FIG. 8 is a flowchart of one embodiment of a method of separating a pre-pulse beam from a main pulse beam by a dichroic beam splitter as described herein.

FIG. 8 is a flowchart of one embodiment of a method of separating the main pulse from the pre-pulse beam using a dichroic beam splitter as described herein. At step 801, a laser pre-pulse is generated, for example, by a seed laser, on a desired beam path toward an irradiation site. At step 802, the pre-pulse is then passed through a first and a second dichroic element, which pass the pre-pulse on toward target material near the irradiation site. At step 803, a laser main pulse is generated, for example by a seed laser, on a desired beam path toward the irradiation site. At step 804, the main pulse is reflected by the first dichroic element to a first reflective element or mirror which reflects the main pulse to a second reflective element or mirror which reflects the main pulse to the second dichroic element which reflects the main pulse to the irradiation site.

In an alternative embodiment, in step 804, the shape of the first mirror is dynamically changed to alter beam characteristics of the reflected main pulse beam. In a still further alternative embodiment, in step 804, the second mirror 110 is adjusted to align the reflected main pulse beam towards the second dichroic mirror to affect the location at which the main pulse encounters the radiation site.

The disclosed method and apparatus has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than those described above. For example, different algorithms and/or logic circuits, perhaps more complex than those described herein, may be used, and possibly different types of drive lasers and/or focus lenses.

It is to be understood that in yet another embodiment, rather than the dichroic beam splitter module passing the pre-pulse through the dichroic elements and reflecting the main pulse by the dichroic elements to separate the beams, the dichroic beam splitter module can instead reflect the pre-pulse by the dichroic elements and pass the main pulse by the dichroic elements to likewise separate the beams. This would be accomplished by changing the dichroic elements to reflect light having the wavelength of the pre-pulse beam and pass light having the wavelength of the main pulse beam as well as either reversing the direction of the target material (along the x-axis) or placing the mirrors above the dichroic elements rather than below them in the dichroic beam splitter as has been shown in the figures.

Note that as used herein, the term "optical component" and its derivatives includes, but is not necessarily limited to, one or more components which reflect and/or transmit and/or operate on incident light and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, neither the terms "optic,"

"optical component" nor their derivatives, as used herein, are meant to be limited to components which operate solely or to advantage within one or more specific wavelength range(s) such as at the EUV output light wavelength, the irradiation laser wavelength, a wavelength suitable for metrology or some other wavelength.

As noted herein, various variations are possible. A single seed laser may be used in some cases rather than the two seed lasers illustrated in the Figures. Likewise, it is to be understood that a beam splitter module according to the present approach can be located anywhere within or affixed to the laser source 12, including as part of the beam expander 52 or beam conditioning unit 24 or focusing unit 22, as appropriate to accomplish the functionality described herein.

It should also be appreciated that the described method and apparatus can be implemented in numerous ways, including as a process, an apparatus, or a system including a computing device or controller to perform certain operations described herein. The methods described herein may be implemented by program instructions for instructing a processor to perform such methods, and such instructions recorded on a computer readable storage medium such as a hard disk drive, floppy disk, optical disc such as a compact disc (CD) or digital versatile disc (UM), flash memory, etc., or a computer network wherein the program instructions are sent over optical or electronic communication links. It should be noted that the order of the steps of the methods described herein may be altered and still be within the scope of the disclosure.

These and other variations upon the embodiments are intended to be covered by the present disclosure, which is limited only by the appended claims.

What is claimed is:

1. A system comprising;
    a laser source configured to produce a first laser light having a first wavelength along a beam path and configured to produce a second laser light having a second wavelength along the beam path;
    and
    a beam splitter module comprising:
        a first dichroic element configured to receive the first laser light along the beam path and pass the first laser light having the first wavelength, the first dichroic element further configured to receive the second laser light along the beam path and reflect the second laser light having the second wavelength,
        a first mirror configured to receive the second laser light reflected from the first dichroic element and reflect the received second laser light,
        a second mirror configured to receive the second laser light reflected from the first mirror and reflect the received second laser light,
        and
        a second dichroic element configured to receive from the first dichroic element the first laser light and pass the first laser light having the first wavelength and configured to receive the second laser light reflected from the second mirror and reflect the second laser light having the second wavelength.

2. The system of claim 1 wherein the laser source is a seed laser.

3. The system of claim 1 wherein the second dichroic element configured to pass the first laser light having the first wavelength is configured to pass the first laser light to target material near an irradiation site.

4. The system of claim 3 wherein the second dichroic element configured to reflect the second laser light having the second wavelength is configured to reflect the second laser light to the irradiation site.

5. The system of claim 4 wherein the first laser light is a pre-pulse beam and the second laser light is a main pulse beam.

6. The system of claim 5 wherein the first dichroic element configured to pass the first laser light having the first wavelength and reflect the second laser light having the second wavelength and the second dichroic element configured to pass the first laser light having the first wavelength and reflect the second laser light having the second wavelength are each accomplished by a dichroic coating on the first dichroic element and the second dichroic element.

7. The system of claim 1 wherein the first mirror has a flat reflective surface.

8. The system of claim 1 wherein the first mirror has a curved reflective surface.

9. The system of claim 1 wherein the second mirror has a flat reflective surface.

10. The system of claim 1 wherein the second mirror has a curved reflective surface.

11. The system of claim 1 wherein the first mirror is a deformable mirror.

12. The system of claim 1 wherein the second mirror is an adjustable mirror.

13. The system of claim 1 wherein the first mirror is an adjustable mirror.

14. The system of claim 1 wherein the second mirror is a deformable mirror.

15. The system of claim 1 wherein the first mirror is both an adjustable mirror and a deformable mirror.

16. The system of claim 1 wherein the second mirror is both an adjustable mirror and a deformable mirror.

17. The system of claim 1 wherein the first dichroic element is adjustable.

18. The system of claim 1 wherein the second dichroic element is adjustable.

19. A method comprising:
    generating a laser pre-pulse having a first wavelength along a beam path;
    passing the laser pre-pulse through a first dichroic element and a second dichroic element to target material near an irradiation site;
    generating a laser main pulse having a second wavelength along the beam path;
    reflecting the laser main pulse by the first dichroic element to a first mirror;
    reflecting the laser main pulse from the first mirror to a second mirror;
    reflecting the laser main pulse from the second mirror to the second dichroic element; and
    reflecting the laser main pulse from the second dichroic element to the irradiation site.

20. The method of claim 19, wherein reflecting the laser main pulse from the first mirror to the second mirror further comprises dynamically changing a shape of the first mirror to alter beam characteristics of the reflected laser main pulse.

21. The method of claim 19, wherein reflecting the laser main pulse from the second mirror to the second dichroic element further comprises adjusting the second mirror to align the laser main pulse to the irradiation site.

22. The method of claim 19 wherein reflecting the laser main pulse from the first mirror to the second mirror further comprises adjusting the first mirror to align the laser main pulse to the irradiation site.

23. The method of claim 19 wherein reflecting the laser main pulse from the second mirror to the second dichroic element further comprises dynamically changing a shape of the second mirror to alter beam characteristics of the reflected laser main pulse.

24. A non-transitory computer-readable medium having embodied thereon a program, the program being executable by a processor to perform a method of protecting a laser pulse source from pulse reflections, the method comprising the steps of:
- generating a laser pre-pulse having a first wavelength along a beam path;
- passing the laser pre-pulse through a through a first dichroic element and a second dichroic element to target material near an irradiation site;
- generating a laser main pulse having a second wavelength along the beam path;
- reflecting the laser main pulse by the first dichroic element to a first mirror;
- reflecting the laser main pulse from the first mirror to a second mirror;
- reflecting the laser main pulse from the second mirror to the second dichroic element; and
- reflecting the laser main pulse from the second dichroic element to the irradiation site.

* * * * *

UNITED STATES PATENT AND TRADEMARK OFFICE
CERTIFICATE OF CORRECTION

PATENT NO. : 8,681,427 B2
APPLICATION NO. : 13/535148
DATED : March 25, 2014
INVENTOR(S) : Robert A. Bergstedt, Christopher Paul Pate and Jason Michael Arcand It is certified that error appears in the above-identified patent and that said Letters Patent is hereby corrected as shown below:

In the Specification
Column 1, line 54, replace "pre-puke" with --pre-pulse--.
Column 1, line 57, replace "main puke" with --main pulse--.
Column 5, line 25, replace "ver," with --however,--.

In the Claims
Column 10, Claim 19, line 41, replace "haying" with --having--.

Signed and Sealed this
Twenty-seventh Day of May, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,681,427 B2  
APPLICATION NO. : 13/535148  
DATED : March 25, 2014  
INVENTOR(S) : Robert A. Bergstedt et al.

Page 1 of 1

It is certified that error appears in the above-identified patent and that said Letters Patent is hereby corrected as shown below:

On the title page  
Item 75 Inventors:, add "; Dr. Martin Lambert, Korb (DE)".  
Item 73 Assignee:, add "; Trumpf Lasersystems for Semiconductor Manufacturing GMBH, Ditzingen (DE)".

Signed and Sealed this  
Sixteenth Day of February, 2016

Michelle K. Lee  
*Director of the United States Patent and Trademark Office*

UNITED STATES PATENT AND TRADEMARK OFFICE
CERTIFICATE OF CORRECTION

PATENT NO. : 8,681,427 B2
APPLICATION NO. : 13/535148
DATED : March 25, 2014
INVENTOR(S) : Robert A. Bergstedt et al.

It is certified that error appears in the above-identified patent and that said Letters Patent is hereby corrected as shown below:

"TITLE PAGE: Item 73

Item 73 Assignee:, add "; Trumpf Lasersystems for Semiconductor Manufacturing GMBH, Ditzingen (DE)"." (as corrected to read in the Certificate of Correction issued February 16, 2016) is deleted and patent is returned to its original state with the applicant & assignee name in patent to read -- Cymer, Inc., San Diego, CA (US) --

Signed and Sealed this
Thirty-first Day of May, 2016

Michelle K. Lee
*Director of the United States Patent and Trademark Office*